United States Patent [19]

Akiyoshi et al.

[11] Patent Number: 5,659,007
[45] Date of Patent: Aug. 19, 1997

[54] PROCESS FOR PRODUCING AROMATIC POLYAMIDE FILM

[75] Inventors: Kazunori Akiyoshi, Tsukuba; Katsuhiko Iwasaki, Toride; Masahiro Niwano; Yoshitaka Ohbe, both of Tsukuba, all of Japan

[73] Assignee: Sumitomo Chemical Company, Limited, Osaka, Japan

[21] Appl. No.: 506,950

[22] Filed: Jul. 26, 1995

[30] Foreign Application Priority Data

Aug. 3, 1994 [JP] Japan .................................. 6-182317

[51] Int. Cl.$^6$ .............................. C08G 69/26; C08G 73/10
[52] U.S. Cl. ..................... 528/310; 528/335; 528/336; 528/348; 528/349; 528/488; 264/165; 264/178 R; 264/184
[58] Field of Search ....................... 528/310, 349, 528/348, 335, 336; 328/488; 264/165, 184, 178 R

[56] References Cited

U.S. PATENT DOCUMENTS

| | | | |
|---|---|---|---|
| 4,368,237 | 1/1983 | Yamada et al. | 428/431 |
| 4,529,763 | 7/1985 | Tamura et al. | 528/488 |
| 4,708,909 | 11/1987 | Ohtsuki et al. | 428/425.9 |

FOREIGN PATENT DOCUMENTS

| | | |
|---|---|---|
| 0091778A2 | 10/1983 | European Pat. Off. . |
| 1507579 | 4/1978 | United Kingdom . |

*Primary Examiner*—Samuel A. Acquah
*Assistant Examiner*—P. Hampton-Hightower
*Attorney, Agent, or Firm*—Watson Cole Stevens Davis, PLLC

[57] ABSTRACT

A process for producing an aromatic polyamide film comprising forming a thin layer of an optically isotropic dope in which an aromatic polyamide is dissolved in a polar amide, immersing the thin layer dope in a polar solvent kept at a temperature not higher than −20° C. to coagulate the dope to form a film and drying the film in the presence of an isocyanate compound. Said process can produce directly a transparent film from an aromatic polyamide dope without requiring the step of dissolving the aromatic polyamide in conc. sulfuric acid, does not require any acid resistant equipment and is inexpensive.

26 Claims, No Drawings

PROCESS FOR PRODUCING AROMATIC POLYAMIDE FILM

BACKGROUND OF THE INVENTION

This invention relates to a process for producing an aromatic polyamide film excellent in tensile strength, tensile modulus of elasticity and transparency which is used in a protective film for lens, a recording magnetic tape and the like.

An aromatic polyamide, particularly all-para aromatic polyamide is one of the polymers having the highest tensile modulus of elasticity among the heretofore known polymers. A film obtained from the aromatic polyamide can be formed into a thin film having a thickness of several micrometers because of its very high tensile modulus of elasticity, and also has excellent heat resistance because of its very high melting point or decomposition temperature.

However, the aromatic polyamide is dissolved in only a special solvent having a high polarity such as conc. sulfuric acid or the like, and hence, is difficult to handle. In addition, the aromatic polyamide has a lyotropic liquid crystallinity, so that only a devitrified, low-strength film containing a great number of crystallites is obtained by a conventional solution-casting method.

As a process for producing a transparent, aromatic polyamide film, JP-A-62-246,719 discloses a process comprising separating as a polymer an aromatic polyamide obtained by polymerization in a solvent such as N-methyl-2-pyrrolidone or the like, subsequently dissolving the polymer in conc. sulfuric acid, moistening the resulting optically anisotropic, conc. sulfuric acid solution at a high temperature to make it optically isotropic, subjecting the same to coagulation and washing, and then heat-treating the resulting film at a temperature of 300° to 500° C. under tension. However, the said process has many steps and requires complicated operations. In addition, the equipment to be used must be resistant to sulfuric acid. Therefore, there is such a problem that the cost becomes very high.

The present inventors have made extensive research for solving the above problems and have consequently found that mechanical strengths such as tensile strength, tensile modulus of elasticity and the like of the aromatic polyamide film can be remarkably enhanced by allowing an isocyanate compound to act on the aromatic polyamide to complete this invention.

SUMMARY OF THE INVENTION

An object of this invention is to provide a process for producing an aromatic polyamide film which process enables the production of a transparent aromatic polyamide film having a high strength and high heat resistance directly from an aromatic polyamide dope without requiring the step of dissolving an aromatic polyamide in conc. sulfuric acid and which process is excellent in productivity, does not require any acid resistant equipment and is inexpensive.

Other objects and advantages of this invention will become apparent from the following description.

According to this invention, there is provided a process for producing an aromatic polyamide film, which comprises:

(1) a thin layer-formation step of forming an optically isotropic aromatic polyamide dope in which the aromatic polyamide is dissolved in a polar amide, into a thin layer, (2) a coagulation step of immersing the aromatic polyamide dope in the form of a thin layer in a polar solvent, other than said polar amide, to coagulate the dope with keeping its optical isotropy, to form a film, and (3) a drying step of drying the film in the presence of an isocyanate compound.

DETAILED DESCRIPTION OF THE INVENTION

In this invention, the aromatic polyamide includes all-para aromatic polyamides.

The all-para aromatic polyamides are those obtained by polycondensation of a para-oriented aromatic diamine with a para-oriented aromatic dicarboxylic acid halide and comprises the recurring units in which the amide linkage is bonded to the aromatic ring at its para position. Specifically, a poly(paraphenylene terephthalamide) obtained by polycondensing para-phenylenediamine with terephthalic acid dichloride can be mentioned as an example.

More specifically, aromatic polyamides consisting of the following recurring structural units (A) and (B):

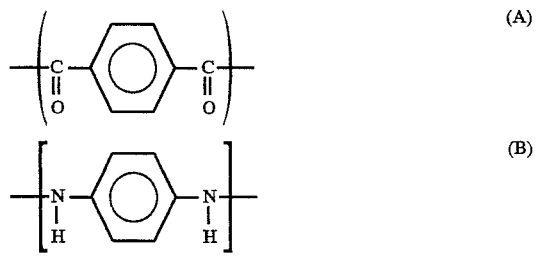

are mentioned.

The molar ratio of the unit (A) to the unit (B) in the aromatic polyamide preferably falls within the range of from 48:52 to 52:48. When the molar ratio of the unit (A) to the unit (B) is less than 48:52 or more than 52:48, molecular weight of the aromatic polyamide obtained unpreferably becomes low.

Also, aromatic polyamides comprising, in addition to the above recurring structural units (A) and (B), a small proportion of the following recurring structural unit (Q) and aromatic polyamide consisting of the following recurring structural unit (Q) are mentioned as examples:

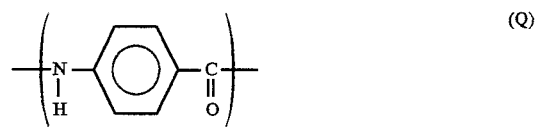

The molar ratio of the unit (Q) to the total of the unit (A) and the unit (B) in the aromatic polyamide is preferably 50:50 or less, more preferably 20:80 or less. When the molar ratio of the unit (Q) to the total of the unit (A) and the unit (B) is more than 50:50, sometimes the strength of the aromatic polyamide obtained unpreferably becomes low.

The aromatic polyamide may contain, in addition to the above-mentioned recurring structural units (A), (B) and (Q), amide linkage, ether linkage, ester linkage, urethane linkage, urea linkage or imide linkage having, for example, an ortho-oriented aromatic, meta-oriented aromatic, nuclear-substituted aromatic, diphenyl, diphenylether, diphenylsulfone or aliphatic skeleton in such a range that the effect of this invention is not damaged.

An inherent viscosity of the aromatic polyamide used in this invention is preferably 1.0 to 2.5 dl/g. When the inherent viscosity is less than 1.0 dl/g, the strength of the film obtained becomes low, and when it is more than 2.5 dl/g, the viscosity of the aromatic polyamide becomes extremely high or separation of the aromatic polyamide is observed. Thus, the state of the dope becomes instable.

Here, the inherent viscosity (η) is calculated according to the following equation from the falling time ratio determined by measuring the falling time at 30° C. of a conc. sulfuric acid solution of an aromatic polyamide having a concentration of 0.5 g/dl and the falling time at 30° C. of the same conc. sulfuric acid as used in the above aromatic polyamide solution:

$$\eta = [ln(T/T_0)]/C \text{ (unit: dl/g)}$$

wherein

T: the falling time of conc. sulfuric acid solution of aromatic polyamide, $T_0$: the falling time of conc. sulfuric acid, C: the concentration (g/dl) of aromatic polyamide in the conc. sulfuric acid solution of aromatic polyamide.

The conc. sulfuric acid used here has a purity of 97% or more.

The optically isotropic aromatic polyamide dope may be obtained by polymerizing an aromatic diamine with an aromatic dicarboxylic acid halide in a polar amide having dissolved therein an alkali metal chloride or an alkaline earth metal chloride or by diluting the polymerization mixture with a solvent.

The polar amide includes N-methyl-2-pyrrolidinone (referred to hereinafter as NMP in some cases), N,N-dimethylformamide, N,N-dimethylacetamide, tetramethylurea and the like.

At the time of the formation of the dope, the molar ratio of the alkali (or alkaline earth) metal chloride to total amide groups in the aromatic polyamide obtained preferably falls within the range of from 1.5 to 2.5. When the ratio is less than 1.5, the shelf life of the dope obtained is short, and hence, the aromatic polyamide is unpreferably easy to be precipitated. When the ratio is more than 2.5, the alkali (or alkaline earth) metal chloride is saturated, and hence, the metal chloride is unpreferably easy to be precipitated.

The aromatic polyamide concentration in the aromatic polyamide dope is preferably 1.0% by weight or more but 4.5% by weight or less. When the aromatic polyamide concentration in the aromatic polyamide dope is less than 1.0% by weight, the strength of a film before drying is low, so that such an aromatic polyamide concentration is not desirable. When the aromatic polyamide concentration in the aromatic polyamide dope is more than 4.5% by weight, the dope becomes a liquid crystal phase and the film after coagulation becomes opaque, so that such an aromatic polyamide concentration is not desirable.

The isocyanate compound used in this invention includes aromatic or aliphatic polyisocyanate having at least two isocyanate groups, its adduct, its modified allophanate, its modified biuret or its modified isocyanurate.

The isocyanate compound used in this invention includes also blocked isocyanates obtained by blocking the aromatic or aliphatic polyisocyanate having at least two isocyanate groups, its adduct, its modified allophanate, its modified biuret or its modified isocyanurate with phenols, β-ketones, malonic esters or lactams.

The phenols include, for example, phenol, m-cresol, p-cresol and the like. The β-ketones include, for example, 3,5-octadione and the like. The malonic esters include, for example, diethyl malonate and the like. The lactams include, for example, ε-caprolactam and the like.

Specific examples of the polyisocyanate include diisocyanates such as tolylene diisocyanate (TDI), methylenedi(p-phenylene) diisocyanate (MDI), crude MDI (polymeric MDI), xylylene diisocyanate (XDI), dianisidine diisocyanate (DADI), diphenyl ether diisocyanate (PEDI), o-tolidine diisocyanate (TODI), naphthalene diisocyanate (NDI), hexamethylene diisocyanate (HDI), isophorone diisocyanate (IPDI), 2,2,4 (or 2,4,4)-trimethylhexamethylene diisocyanate (TMDI), dicyclohexylmethane diisocyanate (hydrogenated MDI) and the like; and triisocyanates such as triphenylmethane triisocyanate, triisocyanatephenyl thiophosphate, 1,6,11-undecatriisocyanate and the like.

Also, the adducts, modified allophanates, modified biurets and modified isocyanurates of these polyisocyanates are included.

The blocked isocyanates include those in which the polyisocyanates illustrated above have been blocked with the above-mentioned phenols, β-ketones, malonic esters or lactams.

Specific examples of the blocked isocyanates include blocked isocyanates represented by the following structural formulas (C), (D), (E), (F), (G), (H) and (I):

(C)

(D)

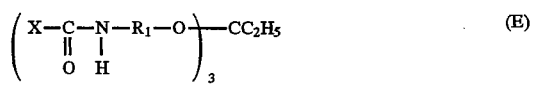
(E)

(F)

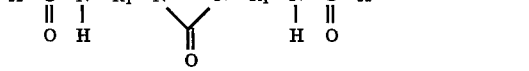

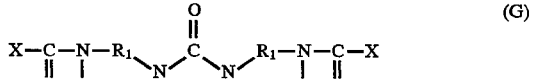
(G)

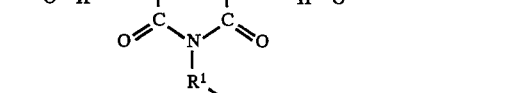

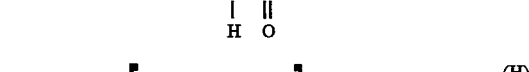

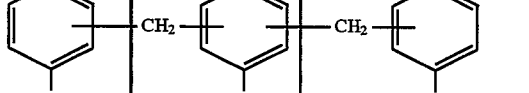
(H)

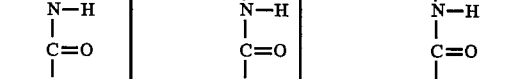

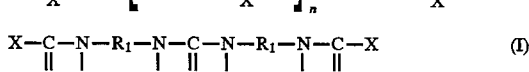

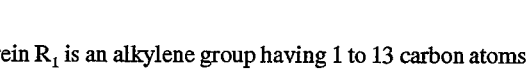
(I)

wherein $R_1$ is an alkylene group having 1 to 13 carbon atoms or selected from the following structural formulas (J), (K), (L), (M) and (R):

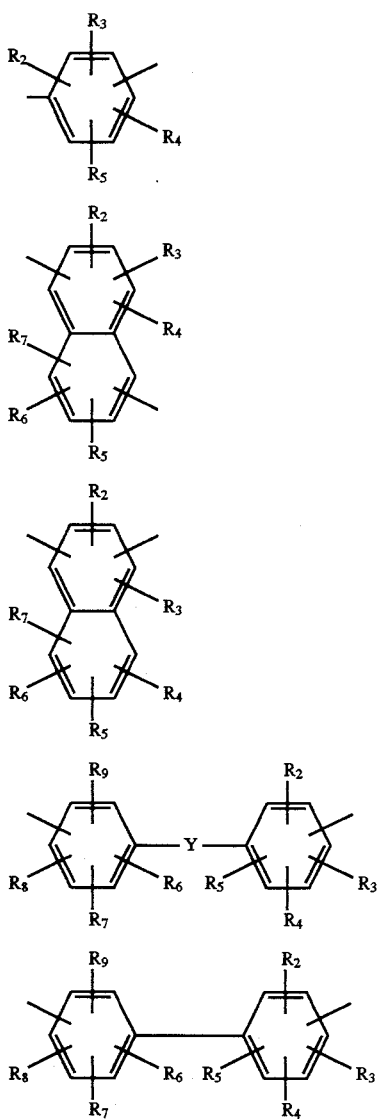

in which $R_2$, $R_3$, $R_4$, $R_5$, $R_6$, $R_7$, $R_8$ and $R_9$ represent independently hydrogen atom, alkyl group having 1 to 4 carbon atoms, phenyl group or halogen atom and Y represents a sulfur atom, an oxygen atom or $SO_2$; and X represents the following structural formula (N), (O) or (P):

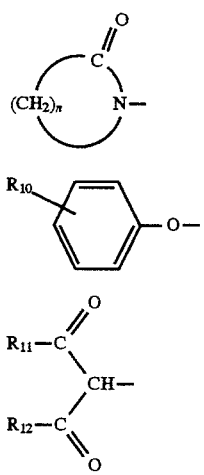

in which n represents an integer of 2 to 11 and $R_{10}$, $R_{11}$ and $R_{12}$ represent independently an alkyl group having 1 to 12 carbon atoms, an alkoxy group having 1 to 12 carbon atoms, a phenyl group having 6 to 12 carbon atoms or a phenoxy group having 6 to 12 carbon atoms.

Here, $R_1$ includes specifically the following groups:

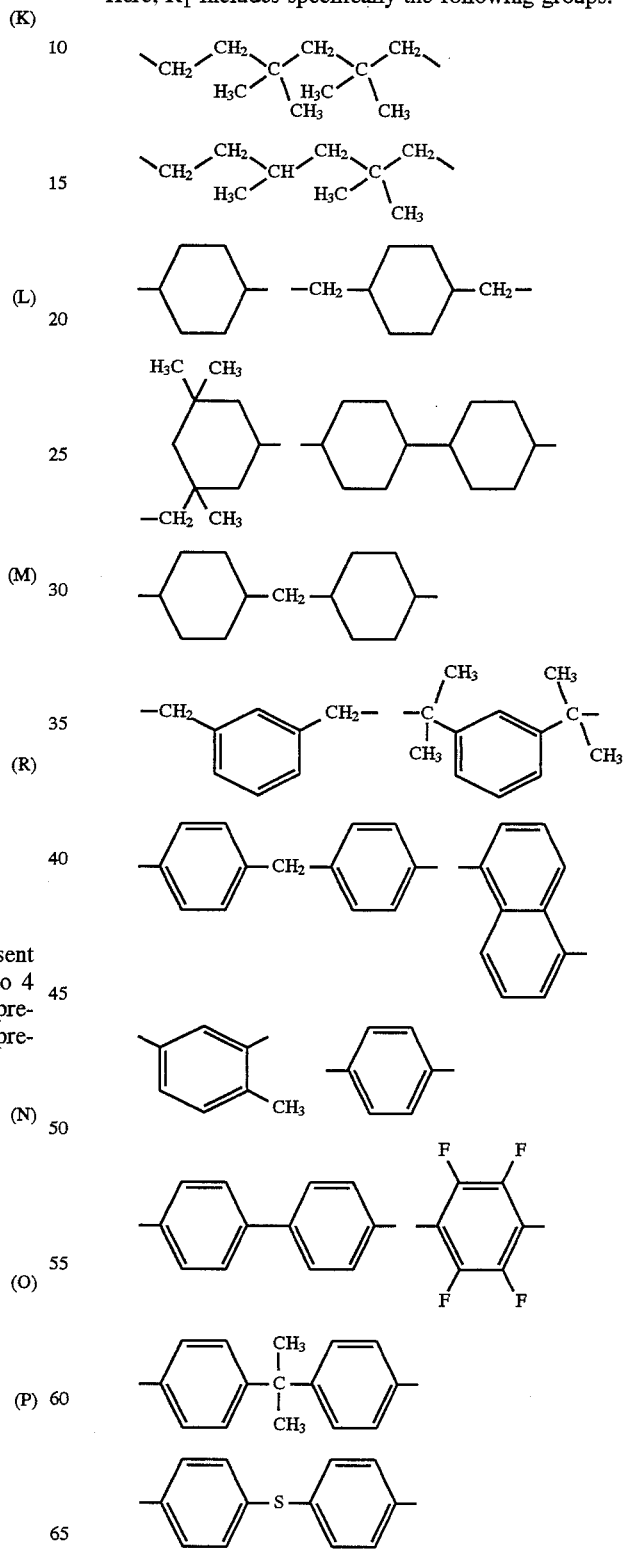

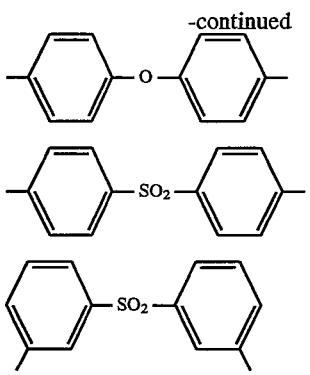

Also, X includes the following groups:

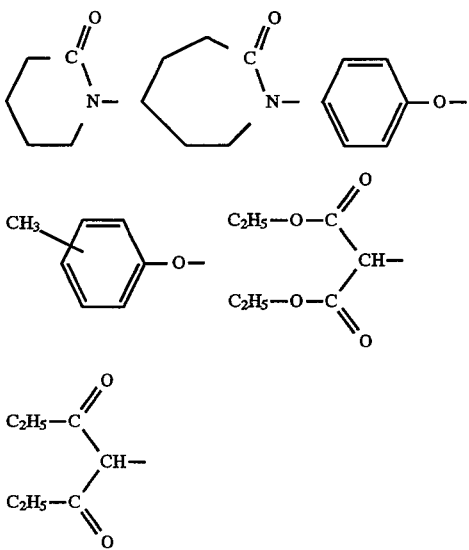

In the process of this invention, the method of forming an optically isotropic dope in which the aromatic polyamide is dissolved in a polar amide into a thin layer is not critical, and includes, for example, a method comprising casting the dope on a support having a smooth surface using a coater such as a bar coater, a roll coater, a doctor blade or the like; and a method comprising extruding the dope through a slit.

The thickness of the thin layer dope preferably falls within the range of from 0.2 to 3.0 mm, more preferably from 0.3 to 1.0 mm, still more preferably from 0.4 to 0.8 mm. When the thickness of the thin layer dope is less than 0.2 mm, sometimes the strength of the film after coagulation unpreferably becomes low. When the thickness of the thin layer is more than 3.0 mm, sometimes the transparency of the film after coagulation unpreferably deteriorates.

Here, as the support, there can be used a band, a film or a drum, at least the surface of which is made of a metal such as steel, stainless steel or the like; a plastic such as polyester, fluoroplastic, engineering plastic or the like; a release paper; or the like.

When the dope is cast by moving the coater side while fixing the support side, a glass plate can be used as the support in addition to the metal plate and resin plate.

Subsequently, the thin layer dope of the aromatic polyamide obtained is immersed in a polar solvent other than the polar amide kept at a temperature not higher than −20° C. The thin layer dope is coagulated in the polar solvent to form a film without losing its optical isotropy.

A desired amount of the polar solvent per the thin layer dope is not critical so far as the amount is excess. The weight ratio of the polar solvent to the thin layer dope is preferably 50:1 or more, more preferably 100:1 or more, still more preferably 200:1 or more. When the ratio is less than 50:1, sometimes the thin layer is not rapidly coagulated into a film, and hence, the transparency of the film obtained unpreferably deteriorates.

The thin layer dope is immersed in the polar solvent for preferably 1 minute or more, more preferably 5 minutes or more, still more preferably 30 minutes or more. When the immersing time is less than 1 minute, sometimes the thin layer dope is not sufficiently coagulated.

The temperature at which the polar solvent is kept is not higher than −20° C., preferably not higher than −30° C., more preferably not higher than −40° C. When the temperature is higher than −20° C., the film loses its optical isotropy during the immersion in the polar solvent, and hence, only a devitrified film is obtained. A temperature not lower than −100° C. can be more easily set and hence is more advantageous in industry than temperatures lower than −100° C.

The polar solvent used in this invention is for coagulating the thin layer dope of aromatic polyamide, so that the solidifying point of the polar solvent is preferably not higher than −25° C., more preferably not higher than −35° C., still more preferably not higher than −45° C., and most preferably lower than −100° C. It is proper that the solidifying point of the polar solvent should be lower than the temperature at which the polar solvent is kept.

The dielectric constant of the polar solvent is preferably at least 10, more preferably at least 20 and particularly preferably at least 30, at 25° C.

The polar solvent is other than the polar amide used in this invention and includes, for example, alcohols such as methanol, ethanol, 1-propanol, 1-butanol, 1,3-propanediol and the like; mixtures of the alcohol and N-methyl-2-pyrrolidinone and/or water comprising the alcohol as the main component; and the like.

Subsequently to the coagulation step, washing can be effected. The washing is effected by treating the coagulated aromatic polyamide film with at least one washing solvent selected from the group consisting of methanol, acetone and water.

The removal of the polar amide and salts from the aromatic polyamide can be achieved to some extent in the coagulation step, so that the coagulation step can be substituted for the washing step.

In this invention, one of the methods of allowing an isocyanate compound to be present in the step of drying the film is to incorporate the isocyanate compound into the aromatic polyamide dope in which the aromatic polyamide is dissolved in a polar amide. This incorporation method includes, for example, a method comprising adding a polar amide having dissolved therein the isocyanate compound to the dope; however, the incorporation method is not particularly limited thereto, and any method capable of obtaining the aromatic polyamide dope in which the isocyanate compound is uniformly dissolved may be used.

The concentration of the isocyanate compound in the optically isotropic aromatic polyamide dope is 0.1% by weight or more but 10% by weight or less, preferably 0.5 to 5.0% by weight and more preferably 1.0 to 3.0% by weight. When the amount of the isocyanate compound added is less than 0.1% by weight, the enhancement of the mechanical strength of the film obtained cannot be expected, and when it exceeds 10% by weight, the isocyanate compound is not uniformly dispersed in the film obtained and separation, deposition and the like are caused.

Another method of allowing the isocyanate compound to be present in the step of drying the film is a method comprising treating the thin layer dope with the isocyanate compound.

The method comprising treating the dope in the form of a thin layer with the isocyanate compound may be a method comprising sprinkling the dope in the form of a thin layer with the isocyanate compound.

The sprinkling of the dope in the form of a thin layer with the isocyanate compound may be effected by directly applying the isocyanate compound to the dope in the form of a thin layer or applying a solution of the isocyanate compound in a solvent to the dope in the form of a thin layer. When the solution of the isocyanate compound in a solvent is applied, it is preferable to use as the solvent the same polar amide as used in the preparation of the dope for preventing the polymer from being separated out of the thin layer dope.

Still another method for allowing the isocyanate compound to be present in the step of drying the film is a method comprising treating with the isocyanate compound the film obtained by coagulating the dope in the form of a thin layer.

The method comprising treating the film obtained by coagulating the dope in the form of a thin layer with the isocyanate compound includes a method comprising sprinkling the film with the isocyanate compound or immersing the film in the isocyanate compound.

The sprinkling of the film with the isocyanate compound may be a direct application of the isocyanate compound to the film or an application of a solution of the isocyanate compound in a solvent.

The sprinkling is preferably carried out after the washing step.

The method comprising immersing the film in the isocyanate compound includes a method comprising immersing the film in a solution of the isocyanate compound in a solvent.

When the film is immersed in the solution of the isocyanate compound in a solvent, the solution of the isocyanate compound may be substituted the coagulating solvent or the washing solvent for. That is to say, for the above-mentioned polar solvent can be substituted a solution of the isocyanate compound in the polar solvent.

The solvent in which the isocyanate compound is dissolved may be any solvent as far as the isocyanate compound is well dissolved therein; however, acetone, methylene chloride and the like are preferable from the viewpoint of the stability of the solvent against the isocyanate compound; the easy removal of the solvent after the treatment with the isocyanate compound; and the like.

The amount of the isocyanate compound contained in the solution of the isocyanate compound in a solvent is 0.1 part by weight or more but 10 parts by weight or less, preferably 0.5 to 5 parts by weight, more preferably 1.0 to 3.0 parts by weight, per 100 parts by weight of the solvent. When the isocyanate compound content in the solution is less than 0.1 part by weight per 100 parts by weight of the solvent, the mechanical strength of the aromatic polyamide film obtained becomes insufficient and when the isocyanate compound content is more than 10 parts by weight per 100 parts by weight of the solvent, the mechanical strength of the aromatic polyamide film becomes saturated, so that such contents are not desirable.

Subsequently, the aromatic polyamide film obtained by sufficient coagulation and washing is fixed with a clamp or on a frame made of a strong and solvent-resistant material such as stainless steel, wood, resin or the like and dried in this state while preventing the shrinkage of the film.

The drying may be an air drying, a hot-air-circulating drying or the like. However, for more effectively allowing the isocyanate compound to react, it is preferable to heat and dry the film at a temperature of 100° C. or more.

The thickness of the film obtained after drying is not particularly critical, however, the thickness preferably falls within the range of from 0.1 to 100 μm from the view point of the strength and transparency of the film.

DESCRIPTION OF THE PREFERRED EMBODIMENTS

This invention is explained in more detail below referring to Examples; however, this invention should not be construed to be limited thereto.

Physical properties were measured by the following methods in the Examples.
(1) Inherent Viscosity The inherent viscosity (η) was calculated according to the following equation from the falling time ratio determined by measuring by means of a Ubbellohde viscometer the falling time at 30° C. of a conc. sulfuric acid solution of aromatic polyamide having a concentration of 0.50 g/dl and the falling time at 30° C. of the same conc. sulfuric acid as used in the conc. sulfuric acid solution of aromatic polyamide:

$$\eta = [ln(T/T_0)]/C \text{ (unit: dl/g)}$$

wherein

T: the falling time of conc. sulfuric acid solution of aromatic polyamide, $T_0$: the falling time of conc. sulfuric acid, C: the concentration of aromatic polyamide in the conc. sulfuric acid solution of aromatic polyamide (g/dl).

The conc. sulfuric acid used here had a purity of 97% or more.
(2) Tensile Test

A test specimen was punched from the film obtained by Dumbbell Cutter SDMK-1223 manufactured by Dumbbell Company and subjected to measurement of tensile strength and tensile modulus of elasticity by means of an Instron type universal tensile tester Model 4301 manufactured by Instron Japan Company according to JIS K-7127.

The isocyanate compounds BI-1 to BI-8 used in the Examples were prepared as follows:

BI-1: In a 100-ml, two-necked flask equipped with a mechanical stirrer, a Dimroth condenser and a three way stop-cock were placed 16.20 g (0.0647 mol) of methylene-di(p-phenylene) diisocyanate (referred to hereinafter as MDI in some cases) and 16.04 g (0.1417 mol) of ε-caprolactam (referred to hereinafter as CLM in some cases), and the temperature was elevated. After the MDI and the CLM were melted, stirring was started and heating with stirring was conducted at 150° C. for five hours. The product was taken out, ground and washed with deionized water. The water-washed product was dried in vacuum at 80° C. and thereafter recrystallized from acetone/water three times to purify the product. The purified product was vacuum-dried at 80° C. to obtain a blocked isocyanate (referred to hereinafter as BI-1).

BI-2: In a 100-ml, two-necked flask equipped with a mechanical stirrer, a Dimroth condenser and a three way stop-cock were placed 27.20 g (0.109 mol) of MDI, 23.50 g (0.217 mol) of m-cresol and 30 ml of toluene, and the mixture was heated under reflux for two hours. After allowing the flask to cool, the crystals separated were collected by filtration, then recrystallized from ethanol and thereafter vacuum-dried at 80° C. to obtain a blocked isocyanate (referred to hereinafter as BI-2).

BI-3: In a 100-ml, two-necked flask equipped with a mechanical stirrer, a Dimroth condenser and a three way stop-cock were placed 16.82 g (0.10 mol) of hexamethylene diisocyanate (referred to hereafter as HDI in some cases) and 22.60 g (0.20 mol) of CLM, and the mixture was heated with stirring at 150° C. for five hours. The product was taken out, ground and washed with deionized water. The washed product was vacuum-dried at 80° C. and then recrystallized from acetone/water three times to purify the product. The purified product was vacuum-dried at 80° C. to obtain a blocked isocyanate (referred to hereinafter as BI-3).

BI-4: In a 200-ml, three-necked flask equipped with a mechanical stirrer, a side tube-attached dropping funnel, a Dimroth condenser and a three way stop-cock were placed 12.01 g (0.0750 mol) of diethyl malonate, 100 ml of THF and 1.73 g (0.0750 mol) of sodium, and the mixture was stirred for four hours until sodium had disappeared completely to complete the reaction. Subsequently, 6.31 g (0.0375 mol) of HDI was dropped over 20 minutes, and the resulting mixture was subjected to reaction with stirring at room temperature for two hours. The THF was removed by distillation under reduced pressure, 100 ml of water was added and acetic acid was added until the mixture became weakly acidic. Upon separation into two layers, the oil layer was purified by reprecipitation from acetone/water, and the precipitate was freeze-dried from dioxane to obtain a blocked isocyanate (referred to hereinafter as BI-4).

BI-5: In a 300-ml, three-necked flask equipped with a mechanical stirrer, a dropping funnel, a Dimroth condenser and a three way stop-cock were placed 104 g (0.206 mol) of Sumidur N3500 (isocyanurate derived from HDI) manufactured by Sumitomo Bayer Urethane K. K. and 70 g (0.62 mol) of CLM, and the resulting mixture was heated with stirring at 150° C. for five hours. The reaction product thus obtained was poured into a large amount of methanol to recover a blocked isocyanate (referred to hereinafter as BI-5).

BI-6: In a 300-ml, three-necked flask equipped with a mechanical stirrer, a dropping funnel, a Dimroth condenser and a three way stop-cock were placed 10 g (0.070 mol) of 3,5-octadiene, 1.61 g (0.070 mol) of sodium and 100 ml of THF, and the resulting mixture was stirred for four hours until the sodium had disappeared to complete the reaction. To the reaction mixture thus obtained was added 11.78 g (0.023 mol) of Sumidur N3500 manufactured by Sumitomo Bayer Urethane K. K. in three portions, and the resulting mixture was subjected to reaction at room temperature for two hours. THF was removed from the reaction mixture by distillation under reduced pressure and acetic acid was added to the reaction mixture until the mixture became weakly acidic. The oil layer thus separated was poured into a large amount of methanol to recover a blocked isocyanate (referred to hereinafter as BI-6).

Incidentally, the reagents used in the synthesis of BI-1 to BI-6 were purified according to the usual method and then weighed in a dry box. The feeding and reaction were conducted under a dried nitrogen stream.

BI-7: A blocked isocyanate derived from tolylene diisocyanate (TDI) manufactured by Sumitomo Bayer Urethane K. K. (Desmodur CT Staple) was used as it was.

BI-8: A isocyanurate derived from HDI manufactured by Sumitomo Bayer Urethane K. K. (Sumidur N3500) was used as it was.

The aromatic polyamide dopes used in the Examples and the Comparative Examples were prepared as follows:

A 500-ml separable flask equipped with an anchor-shaped agitating blade, a Dimroth condenser and a three way stop-cock was sufficiently purged with nitrogen. In this flask were placed 31.90 g of $CaCl_2$ which had previously been vacuum-dried at 200° C. for two hours or more and 463.5 g of N-methyl-2-pyrrolidinone (NMP) from which water was sufficiently removed, and the contents of the flask were heated and stirred in an oil bath at 100° C. for one hour.

After it was confirmed that $CaCl_2$ was sufficiently dissolved in NMP, the solution was allowed to cool to room temperature. To this NMP solution was added 14.62 (0.135 mol) of paraphenylenediamine (referred to hereinafter as PPD in some cases) which had been weighed in a dry box, and the mixture was stirred and dissolved. After it was confirmed that the PPD was sufficiently dissolved in the NMP, the solution was cooled in an ice-water bath.

Subsequently, 26.53 g (0.131 mol) of terephthalic acid dichloride (referred to hereinafter as TPC in some cases) weighed in a dry box was added to this NMP solution. The addition of this TPC was conducted in several portions under a nitrogen stream over 20 minutes while the internal temperature was kept at 0°–10° C.

After completion of the addition of the TPC to the NMP solution, stirring was continued for two hours while the internal temperature was kept at 0°–5° C. Thereafter, the pressure of the system was reduced by a vacuum pump for a further 30 minutes to remove compounds having low boiling points, after which nitrogen was introduced into the system to return the pressure to the ordinary pressure, thereby completing the polymerization.

The above-mentioned synthesis of aromatic polyamide was carried out throughout under a dried nitrogen atmosphere to prevent the outside air, particularly moisture, from being introduced into the system, as much as possible. Thus, an optically anisotropic aromatic polyamide dope was obtained.

The concentration of the aromatic polyamide in this dope was 6% by weight, and the inherent viscosity of this aromatic polyamide was 1.72 dl/g.

EXAMPLES 1 to 18

First of all, an optically isotropic aromatic polyamide dope was prepared as follows:

The isocyanate compound shown in Table 1 was dissolved in NMP to prepare an NMP solution of the isocyanate compound having a concentration two times the concentration shown in Table 1.

The optically anisotropic aromatic polyamide dope was diluted with the NMP solution, in which isocyanate compound had previously dissolved, to prepare an optically isotropic aromatic polyamide dope having the isocyanate concentration shown in Table 1. The optically isotropic aromatic polyamide dope was prepared so that the concentration of the aromatic polyamide in this dope be 3% by weight.

The optically isotropic aromatic polyamide dope thus prepared was allowed to flow down on a well-polished glass plate and formed into a thin layer having a thickness of 0.6 mm using automatic coating equipment PI-1210 manufactured by Tester Sangyo K. K. and a wedge bar manufactured by Matsuo Sangyo K. K.

Subsequently, the aromatic polyamide dope formed into a thin layer was immersed for 30 minutes in methanol kept at a temperature not higher than −70° C. with dry ice to cool and coagulate the dope.

Subsequently, the aromatic polyamide coagulated in the form of a film was immersed in methanol at room temperature for 30 minutes and then washed.

Subsequently, the aromatic polyamide coagulated in the form of a film after the washing was sandwiched in between two ring-shaped Teflon frames having a inner diameter of 10 cm, an outer diameter of 15 cm and a thickness of 5 mm and the frames were clipped. Incidentally, filter papers were inserted into both of outer sides of the polyamide film between the Teflon frames and the coagulated aromatic polyamide film to accelerate the drying of the portion of the film sandwiched in between the frames.

The coagulated aromatic polyamide film fixed between the frames was air-dried at room temperature, and thereafter, dried at 100° C. for two hours and then at 200° C. for one hour, to obtain a transparent aromatic polyamide film.

The transparent aromatic polyamide film thus obtained was subjected to a tensile test to obtain the results shown in Table 1.

Comparative Example 1

The same procedure as in Example 1 was repeated, except that in the preparation of the aromatic polyamide dope, the aromatic polyamide dope previously obtained was diluted with NMP free from isocyanate compound, to prepare a transparent aromatic polyamide film.

The aromatic polyamide film thus obtained was subjected to a tensile test to obtain the results shown in Table 1.

TABLE 1

|  | Isocyanate compound | | Tensile test | |
| --- | --- | --- | --- | --- |
|  | Lot No. | Content in dope (wt. %) | Tensile strength (kgf/mm²) | Tensile Modulus (kgf/mm²) |
| Example 1 | BI-1 | 0.6 | 22.9 | 1340 |
| Example 2 | BI-1 | 1.0 | 21.1 | 1150 |
| Example 3 | BI-2 | 0.5 | 20.9 | 1220 |
| Example 4 | BI-2 | 1.0 | 21.7 | 1270 |
| Example 5 | BI-2 | 3.0 | 25.7 | 1340 |
| Example 6 | BI-3 | 0.5 | 23.5 | 1310 |
| Example 7 | BI-3 | 1.0 | 21.4 | 1120 |
| Example 8 | BI-3 | 3.0 | 25.4 | 1340 |
| Example 9 | BI-4 | 1.0 | 21.9 | 1360 |
| Example 10 | BI-5 | 1.0 | 26.5 | 1140 |
| Example 11 | BI-5 | 2.0 | 25.9 | 1150 |
| Example 12 | BI-6 | 0.5 | 21.9 | 1200 |
| Example 13 | BI-6 | 1.0 | 22.1 | 1260 |
| Example 14 | BI-6 | 3.0 | 22.8 | 1240 |
| Example 15 | BI-7 | 0.5 | 23.9 | 1350 |
| Example 16 | BI-7 | 0.1 | 25.2 | 1300 |
| Example 17 | BI-7 | 0.3 | 21.1 | 1070 |
| Example 18 | BI-8 | 3.0 | 24.2 | 1350 |
| Comp. Example 1 | — | — | 18.4 | 970 |

EXAMPLES 19 to 24

The same procedure as in Example 1 was repeated, except that in the step of preparing an optical isotropic aromatic polyamide dope, the aromatic polyamide dope previously obtained was diluted with NMP free from isocyanate compound and in the step of washing, the acetone solution of the isocyanate compound shown in Table 2 was used as the washing solvent, to prepare an aromatic polyamide film.

The aromatic polyamide film thus obtained was subjected to a tensile test to obtain the results shown in Table 2.

EXAMPLE 25

The same procedure as in Example 1 was repeated, except that in the step of preparing an optically isotropic aromatic polyamide dope, the aromatic polyamide dope previously obtained was diluted with NMP free from isocyanate compound and after the step of washing, the washed aromatic polyamide film was sprinkled with a 1.0% by weight acetone solution of the isocyanate compound shown in Table 2 by means of a sprayer, to prepare an aromatic polyamide film.

The aromatic polyamide film thus obtained was subjected to a tensile test to obtain the results shown in Table 2.

TABLE 2

|  | Isocyanate compound | | Tensile test | |
| --- | --- | --- | --- | --- |
|  | Lot No. | Content in acetone (phr) | Tensile strength (kgf/mm²) | Tensile Modulus (kgf/mm²) |
| Example 19 | BI-5 | 1.0 | 26.4 | 1320 |
| Example 20 | BI-5 | 3.0 | 28.8 | 1310 |
| Example 21 | BI-5 | 6.0 | 23.6 | 1130 |
| Example 22 | BI-6 | 3.0 | 25.5 | 1410 |
| Example 23 | BI-7 | 1.0 | 23.9 | 1260 |
| Example 24 | BI-8 | 3.0 | 23.0 | 1090 |
| Example 25 | BI-5 | 1.0 | 25.4 | 1340 |

The process for producing an aromatic polyamide film of this invention is more advantageous than a conventional process for producing a film from a sulfuric acid solution of an aromatic polyamide in that the former is fewer in the number of steps than the latter, does not require any acid-resistant equipment, and can produce very simply an aromatic polyamide film excellent in physical properties such as tensile strength and tensile modulus of elasticity.

The aromatic polyamide film excellent in transparent obtained by the production process of this invention is excellent in heat resistance, chemical resistance, abrasion resistance and electrical insulation, and hence, can be used in a lens-protective film, a protective film for front glass of automobile, train, aircraft or the like, a protective film for sight glass of boiler, a coating tape for electric wire and optical fiber, a flexible printed wiring board, a magnetic recording tape and the like.

What is claimed is:

1. A process for producing an aromatic polyamide film, which comprises:

(1) a thin layer-formation step of forming an optically isotropic aromatic polyamide dope in which the aromatic polyamide is dissolved in a polar amide solvent, into a thin layer, (2) a coagulation step of immersing the aromatic polyamide dope in the form of a thin layer in a polar solvent, other than said polar amide solvent, wherein the polar solvent is kept at a temperature not higher than −20° C., to coagulate the dope with keeping its optical isotropy, to form a film and (3) a drying step of drying the film in the presence of an isocyanate compound.

2. The process for producing an aromatic polyamide film according to claim 1, wherein the aromatic polyamide is composed of the following recurring structural units (A) and (B):

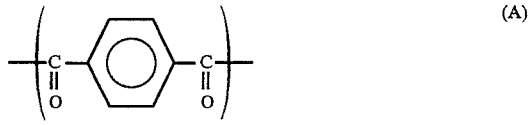

and

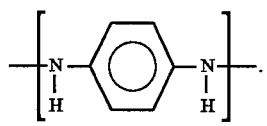
(B)

3. The process for producing an aromatic polyamide film according to claim 1, wherein the isocyanate compound is an aromatic or aliphatic polyisocyanate, its adduct, its modified allophanate, its modified biuret or its modified isocyanurate.

4. The process for producing an aromatic polyamide film according to claim 1, wherein the isocyanate compound is a blocked isocyanate obtained by blocking an aromatic or aliphatic polyisocyanate, its adduct, its modified allophanate, its modified biuret or its modified isocyanurate with a phenol, a β-ketone, a malonic ester or an ε-caprolactam.

5. The process for producing an aromatic polyamide film according to claim 1, wherein the aromatic polyamide dope is a solution obtained by polymerizing an aromatic diamine with an aromatic dicarboxylic acid halide in a polar amide solvent having dissolved therein a chloride of an alkali metal or alkaline earth metal, or a diluted solution of said solution.

6. The process for producing an aromatic polyamide film according to claim 1, wherein the polar amide is N-methyl-2-pyrrolidinone, N,N-dimethylformamide, N,N-dimethylacetamide or tetramethylurea.

7. The process for producing an aromatic polyamide film according to claim 1, wherein the polar solvent is at least one alcohol selected from the group consisting of methanol, ethanol, 1-propanol, 1-butanol and 3-propanediol, or a mixture comprising the above alcohol as the main component and at least one member selected from the group consisting of N-methyl-2-pyrrolidinone and water.

8. The process for producing an aromatic polyamide film according to claim 1, wherein the aromatic polyamide dope to be subjected to the thin layer-formation step is treated with the isocyanate compound for allowing the isocyanate compound to be present in the drying step.

9. The process for producing an aromatic polyamide film according to claim 8, wherein the aromatic polyamide dope treated has uniformly dissolved therein the isocyanate compound.

10. The process for producing an aromatic polyamide film according to claim 9, wherein the concentration of the isocyanate compound in the aromatic polyamide dope is 0.1% by weight or more but 10% by weight or less.

11. The process for producing an aromatic polyamide film according to claim 1, wherein the aromatic polyamide dope in the form of a thin layer is treated with the isocyanate compound before the coagulation step.

12. The process for producing an aromatic polyamide film according to claim 11, wherein the treatment with the isocyanate compound is effected by sprinkling the aromatic polyamide dope in the form of a thin layer with the isocyanate compound.

13. The process for producing an aromatic polyamide film according to claim 12, wherein the sprinkling is effected by a direct application of the isocyanate compound or an application of a solution of the isocyanate compound in the same polar amide as used in the preparation of the aromatic polyamide dope.

14. The process for producing an aromatic polyamide film according to claim 12 or 13, wherein the sprinkling is effected by means of a sprayer.

15. The process for producing an aromatic polyamide film according to claim 13, wherein the isocyanate compound content in the solution of the isocyanate compound is 0.1 parts by weight or more but 10 parts by weight of less per 100 parts by weight of the polar amide.

16. The process for producing an aromatic polyamide film according to claim 1, wherein the film obtained in the coagulation step is treated with the isocyanate compound before the drying step.

17. The process for producing an aromatic polyamide film according to claim 16, wherein the treatment with the isocyanate compound is effected by sprinkling the film with the isocyanate compound.

18. The process for producing an aromatic polyamide film according to claim 17, wherein the sprinkling is effected by a direct application of the isocyanate compound or an application of a solution of the isocyanate compound in a solvent.

19. The process for producing an aromatic polyamide film according to claim 17, wherein the sprinkling is effected after the film has been washed with a washing solvent.

20. The process for producing an aromatic polyamide film according to claim 17, 19 wherein the sprinkling is effected by means of a sprayer.

21. The process for producing an aromatic polyamide film according to claim 18, wherein the solvent is acetone or methylene chloride.

22. The process for producing an aromatic polyamide film according to claim 18, the content of the isocyanate compound in the solution of the isocyanate compound is 0.1 part by weight or more but 10 parts by weight or less per 100 parts by weight of the solvent.

23. The process for producing an aromatic polyamide film according to claim 16, wherein the treatment with the isocyanate compound is effected by immersing the film in a solution of the isocyanate compound in a solvent.

24. The process for producing an aromatic polyamide film according to claim 23, wherein the solvent is acetone or methylene chloride.

25. The process for producing an aromatic polyamide film according to claim 23, wherein the content of the isocyanate compound in the solution of the isocyanate compound is 0.1 part by weight or more but 10 parts by weight or less per 100 parts by weight of the solvent.

26. The process for producing an aromatic polyamide film according to claim 1, wherein in the drying step, the film is heated and dried at a temperature of 100° C. or higher.

* * * * *